United States Patent
Wang et al.

(10) Patent No.: US 9,397,066 B2
(45) Date of Patent: Jul. 19, 2016

(54) BOND WIRE FEED SYSTEM AND METHOD THEREFOR

(71) Applicants: Zhijie Wang, Tianjin (CN); Zhigang Bai, Tianjin (CN); Huchang Zhang, Tianjin (CN)

(72) Inventors: Zhijie Wang, Tianjin (CN); Zhigang Bai, Tianjin (CN); Huchang Zhang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/693,881

(22) Filed: Apr. 23, 2015

(65) Prior Publication Data
US 2016/0155718 A1    Jun. 2, 2016

(30) Foreign Application Priority Data
Dec. 1, 2014    (CN) .......................... 2014 1 0858023

(51) Int. Cl.
| | |
|---|---|
| *B23K 31/02* | (2006.01) |
| *H01L 23/00* | (2006.01) |
| *B23K 31/12* | (2006.01) |
| *B23K 37/047* | (2006.01) |
| *B23K 20/00* | (2006.01) |

(52) U.S. Cl.
CPC .............. *H01L 24/78* (2013.01); *B23K 20/005* (2013.01); *B23K 31/12* (2013.01); *B23K 37/047* (2013.01); *H01L 2224/789* (2013.01); *H01L 2224/78611* (2013.01); *H01L 2224/78621* (2013.01); *H01L 2224/78631* (2013.01)

(58) Field of Classification Search
None
See application file for complete search history.

(56) References Cited

U.S. PATENT DOCUMENTS

| | | | | |
|---|---|---|---|---|
| 3,340,596 A | * | 9/1967 | Rozmus | B23K 20/028 228/115 |
| 3,643,321 A | * | 2/1972 | Field | H01L 24/85 228/180.5 |
| 4,584,442 A | | 4/1986 | Shields | |
| 4,597,522 A | * | 7/1986 | Kobayashi | B23K 20/007 219/56.1 |
| 4,763,826 A | | 8/1988 | Kulicke | |
| 4,998,002 A | * | 3/1991 | Okikawa | B23K 20/007 219/56.22 |
| 5,031,821 A | * | 7/1991 | Kaneda | B23K 20/007 228/110.1 |
| 5,037,023 A | * | 8/1991 | Akiyama | B23K 20/007 228/102 |
| 5,101,263 A | * | 3/1992 | Kitano | H01L 24/85 257/734 |

(Continued)

FOREIGN PATENT DOCUMENTS

| | | | |
|---|---|---|---|
| JP | 01028929 A | * | 1/1989 |
| JP | 2885242 B1 | * | 4/1999 |

*Primary Examiner* — Kiley Stoner
(74) *Attorney, Agent, or Firm* — Charles E. Bergere (57) ABSTRACT

A bond wire feed system has a wire tensioning unit with a chamber that has a wire inlet aperture and a wire outlet aperture. The wire inlet and outlet apertures have centers that are aligned with a central axis of the chamber. A clamp is positioned to receive a bond wire provided from the wire outlet aperture. The clamp has at least two jaws movable relative to each other and arranged to grip the wire to align a central axis of the wire with the central axis of the chamber. The jaws are also movable along the central axis of the wire in order to pull the wire through the wire tensioning unit.

18 Claims, 9 Drawing Sheets

(56) References Cited

U.S. PATENT DOCUMENTS

| | | | | |
|---|---|---|---|---|
| 5,152,450 A * | 10/1992 | Okikawa | ............... | B23K 20/007 228/180.5 |
| 5,176,310 A * | 1/1993 | Akiyama | ............... | B23K 1/0008 228/180.5 |
| 5,238,173 A * | 8/1993 | Ura | ............... | B23K 20/007 228/104 |
| 5,275,324 A * | 1/1994 | Yamazaki | ............... | B23K 20/10 228/1.1 |
| 5,285,949 A * | 2/1994 | Okikawa | ............... | B23K 20/007 228/179.1 |
| 5,314,175 A * | 5/1994 | Izumi | ............... | B25B 5/06 228/4.5 |
| 5,402,927 A | 4/1995 | Frasch | | |
| 5,564,616 A * | 10/1996 | Torihata | ............... | B23K 20/005 228/180.5 |
| 5,667,130 A * | 9/1997 | Morita | ............... | B23K 20/005 228/1.1 |
| 5,685,476 A * | 11/1997 | Miyoshi | ............... | B23K 20/007 228/180.5 |
| 5,791,550 A | 8/1998 | Kobayashi | | |
| 5,797,388 A * | 8/1998 | Nakamura | ............... | B23K 20/007 219/56.21 |
| 6,098,868 A * | 8/2000 | Mae | ............... | B23K 20/007 228/102 |
| 6,173,879 B1 * | 1/2001 | Chiba | ............... | B23K 20/007 228/1.1 |
| 6,282,780 B1 * | 9/2001 | Waki | ............... | H01L 24/11 228/180.5 |
| 6,302,317 B1 * | 10/2001 | Narita | ............... | H01L 21/67138 228/179.1 |
| 6,439,496 B2 | 8/2002 | Terakado | | |
| 6,474,538 B1 * | 11/2002 | Yonezawa | ............... | H01L 24/78 228/180.5 |
| 6,520,400 B2 | 2/2003 | Ditri | | |
| 6,789,721 B2 | 9/2004 | Stilwell | | |
| 7,025,243 B2 | 4/2006 | Wong | | |
| 8,459,530 B2 | 6/2013 | Zhang | | |
| 2001/0004991 A1 * | 6/2001 | Mochida | ............... | B23K 20/007 228/103 |
| 2002/0023942 A1 * | 2/2002 | Terakado | ............... | B23K 20/005 228/180.5 |
| 2003/0042296 A1 * | 3/2003 | Stilwell | ............... | B23K 20/005 228/180.5 |
| 2003/0094481 A1 * | 5/2003 | Horie | ............... | B23K 20/007 228/180.22 |
| 2003/0162378 A1 * | 8/2003 | Mikami | ............... | B23K 20/005 438/612 |
| 2004/0112936 A1 * | 6/2004 | Hixon, Jr. | ............... | H02G 1/005 228/44.3 |
| 2004/0188499 A1 * | 9/2004 | Nosaka | ............... | B23K 20/005 228/180.5 |
| 2006/0091181 A1 * | 5/2006 | Eder | ............... | B23K 9/1336 228/4.5 |
| 2006/0219754 A1 * | 10/2006 | Clauberg | ............... | B08B 7/00 228/4.5 |
| 2007/0023487 A1 * | 2/2007 | Ko | ............... | B23K 20/007 228/180.5 |
| 2007/0187138 A1 * | 8/2007 | Takahashi | ............... | H01L 24/78 174/257 |
| 2009/0200357 A1 * | 8/2009 | Lee | ............... | B23K 20/007 228/44.7 |
| 2009/0308904 A1 * | 12/2009 | Qin | ............... | B23K 20/004 226/1 |
| 2011/0000951 A1 * | 1/2011 | Qin | ............... | B23K 20/007 228/103 |
| 2011/0101073 A1 * | 5/2011 | Zhang | ............... | B23K 20/005 228/103 |
| 2012/0132695 A1 * | 5/2012 | Zhang | ............... | B23K 20/005 228/44.3 |
| 2013/0056448 A1 * | 3/2013 | Kim | ............... | H01L 24/78 219/121.63 |
| 2013/0167373 A1 * | 7/2013 | Hwang | ............... | H01L 24/11 29/879 |
| 2014/0131425 A1 * | 5/2014 | Liu | ............... | B23K 3/08 228/104 |
| 2014/0209663 A1 * | 7/2014 | Song | ............... | H01L 24/85 228/102 |
| 2014/0263584 A1 * | 9/2014 | Yap | ............... | H01L 24/85 228/180.5 |
| 2014/0339290 A1 * | 11/2014 | Han | ............... | H01L 24/85 228/180.5 |
| 2014/0374467 A1 * | 12/2014 | Yap | ............... | H01L 24/85 228/180.5 |
| 2015/0008251 A1 * | 1/2015 | Song | ............... | B23K 3/063 228/41 |
| 2015/0128405 A1 * | 5/2015 | Zhang | ............... | B25J 15/0028 29/559 |

* cited by examiner

BOND WIRE FEED SYSTEM AND METHOD THEREFOR

BACKGROUND OF THE INVENTION

The present invention relates generally to bond wire feed systems and more particularly, to an automatic feeding and threading system for a wire bonding machine.

Semiconductor integrated circuits or dies are continually decreasing in size and therefore the diameter of the bond wires used during interconnecting semiconductor die electrodes to external leads is also shrinking. As a result of this shrinking, manual wire threading during bond wire spool changing, or wire bond trouble shooting, becomes more time consuming for operators.

In addition to the reduced diameters of bond wires, there is a move towards palladium coated copper bond wires, which are difficult to distinguish from the background of a bonding machine. As a result, damage to die electrodes may occur when wire bonding is attempted when an undetected insufficient bond wire length protrudes through the capillary welding tube. This insufficient bond wire length (short tail or no tail) is caused when the bond wire does not protrude sufficiently from the end of the capillary bonding head after a successful bond.

Therefore, it is an object of the present invention to at least alleviate one of the problems associated with bond wire feeding.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides for a wire feed system for a wire bonding machine. The system includes a wire tensioning unit having a chamber with a wire inlet aperture and a wire outlet aperture with centers that are aligned with a central axis of the chamber. There is a clamp positioned to receive a bond wire provided from the wire outlet aperture, the clamp has at least two jaws movable relative to each other. The jaws are arranged to grip the wire to align a central axis of the wire with the central axis of the chamber. The jaws are movable along the central axis of the wire thereby providing for pulling the wire through the wire tensioning unit.

In another embodiment, the present invention provides for method of feeding a bond wire to a wire bonding machine. The method includes feeding the bond wire through a wire tensioning unit having a chamber with a wire inlet aperture and a wire outlet aperture that have centers that are aligned with a central axis of the chamber. The method performs a process of clamping the bond wire with a clamp positioned to receive the bond wire provided from the wire outlet aperture. The clamp has at least two jaws movable relative to each other. The jaws are arranged to grip the wire to align a central axis of the wire with the central axis of the chamber. The method also performs moving the jaws along the central axis of the wire thereby providing for pulling the wire through the wire tensioning unit.

Figure 1:
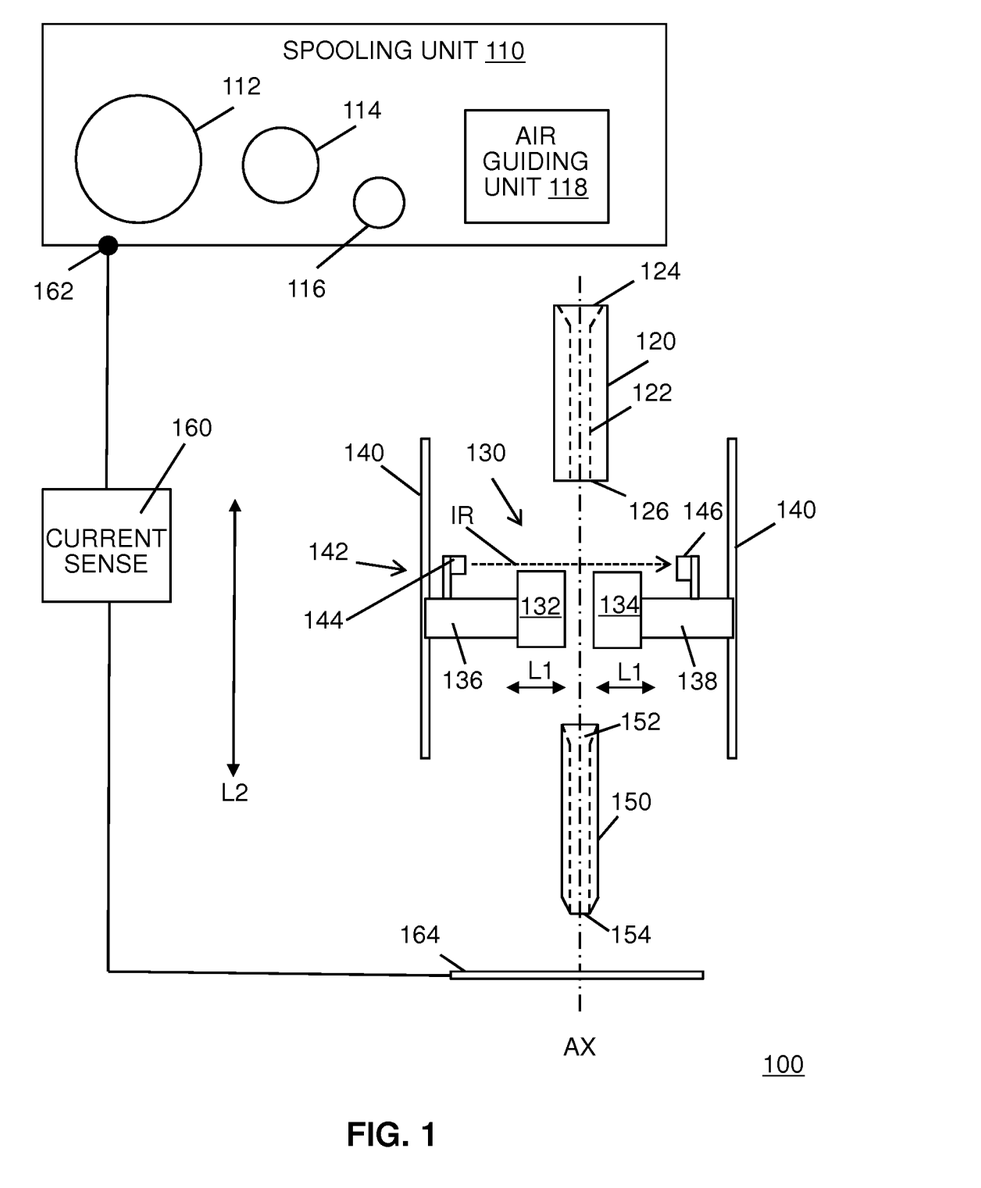
FIG. 1 is a schematic diagram of a wire feed system for a wire bonding machine in accordance with a preferred embodiment of the present invention.

Referring now to FIG. 1 there is illustrated a schematic diagram of a wire feed system 100 for a wire bonding machine in accordance with a preferred embodiment of the present invention. The wire feed system 100 includes a wire spooling unit 110 and a wire tensioning unit 120. The wire spooling unit 110 has a spooler 112, guide rollers 114, 116 and a wire air guiding unit 118. The wire tensioning unit 120 includes an elongate chamber 122 with a tapered frusto-conical wire inlet aperture 124 and a wire outlet aperture 126. Also, the centers these apertures 126, 126 are aligned with a central axis of the chamber AX.

The wire feed system 100 includes a clamp 130 positioned to receive a wire provided from the wire outlet aperture. The clamp 130 has two jaws 132, 134 that are mounted on respective carriage arms 136, 138 and allow the jaws 132, 134 to be movable relative to each other in a direction indicated by arrowed lines L1. The carriage arms 136, 138 are mounted on track rails 140 thereby allowing the clamp 130 to move towards and away from the wire tensioning unit 120 as indicated by arrowed line L2.

There is sensor 142 comprising a transmitter 144 and a receiver 146 located to detect the presence of a wire when protruding from the wire outlet aperture 126. In this embodiment, the transmitter 144 is mounted on the carriage arm 136 and the receiver 146 is mounted on carriage arm 138. The transmitter 144 is normally an infra-red transmitter which transmits an infra-red signal IR to the receiver 146. When the wire breaks (blocks) the infra-red signal IR, the receiver 146 detects the presence of the wire.

The wire feed system 100 also includes a capillary welding tube 150 with a tapered capillary welding tube inlet 152 and capillary welding tube outlet 154. The centers of the tapered capillary welding tube inlet 152 and capillary welding tube outlet 154 are aligned with the central axis of the capillary welding tube 150 which is also in alignment with the central axis of the chamber AX. There is also a current sensing circuit 160 with two nodes 162, 164 and first one of the nodes 162 is in located on the wire spooling unit 110 and a second one of the nodes 164 is a metal plate for supporting a sheet of lead frames (as shown).

Figure 2:
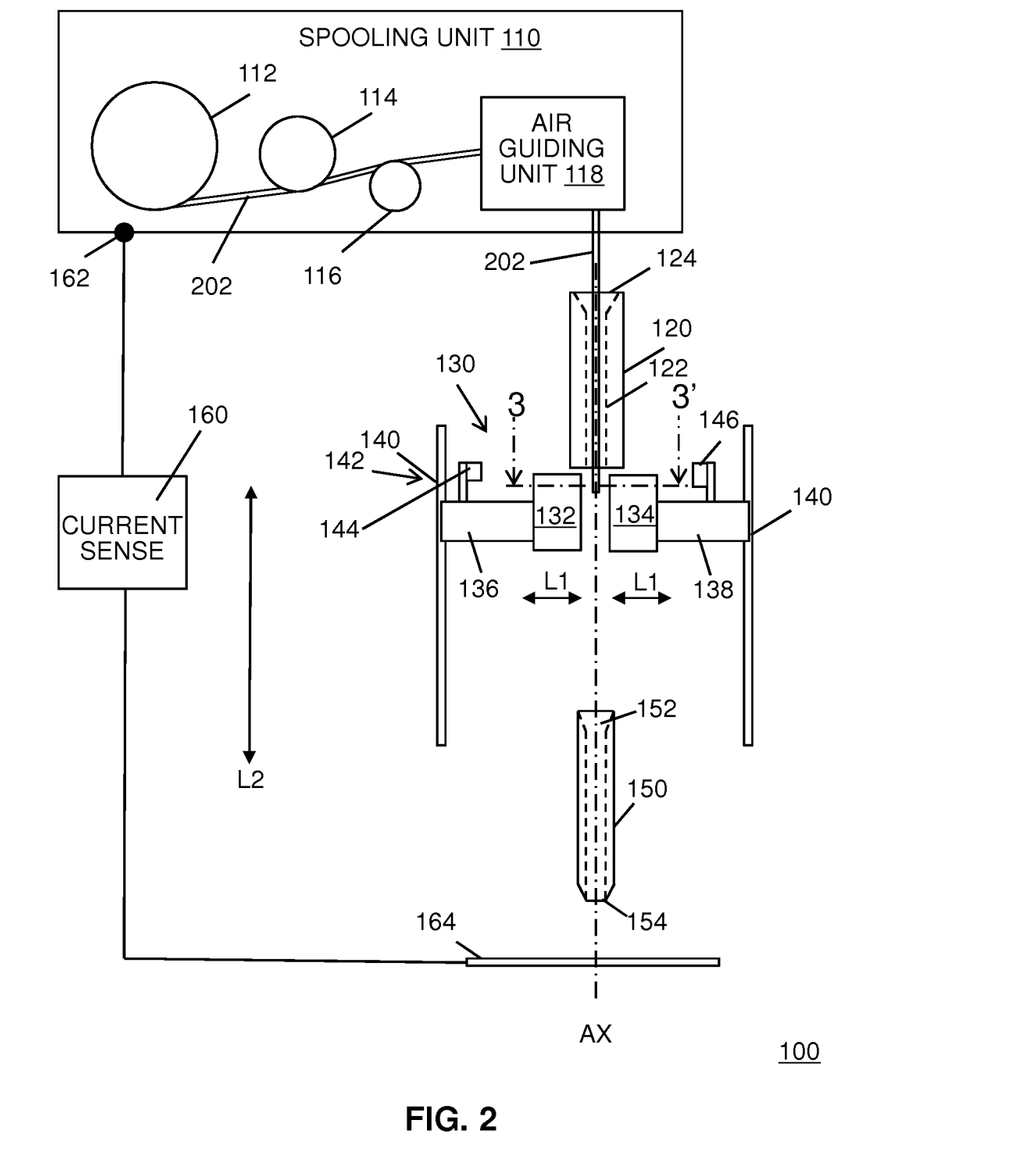
FIG. 2 is a schematic diagram of the wire feed system in a first operating position when feeding a bond wire in accordance with a preferred embodiment of the present invention.

Referring to FIG. 2 there is illustrated a schematic diagram of the wire feed system 100 in a first operating position when feeding a bond wire 202 in accordance with a preferred embodiment of the present invention. In this first operating position the clamp 130 has moved along the rails 140 towards the wire tensioning unit 120. Also, the bond wire 202 has been fed from the spooler 112 across the guide rollers 114, 116 and is guided through the wire tensioning unit 120 by the wire air guiding unit 118. When the bond wire 202 protrudes out of the elongate chamber 122 past the wire outlet aperture 126 the infra-red signal IR is blocked from reaching receiver 146 thereby detecting the presence of the wire 202.

Figure 3:
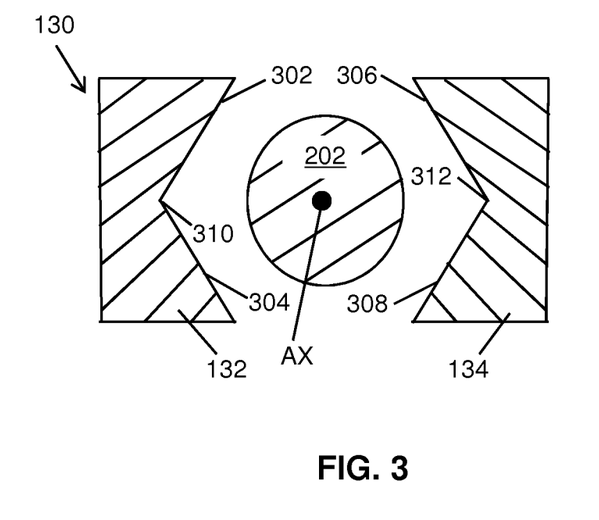
FIG. 3 is a schematic cross sectional plan view of a clamp of FIG. 2 in an open position, through 3-3', in accordance with a first preferred embodiment of the present invention.

Referring to FIG. 3 there is illustrated a schematic cross sectional plan view of the clamp 130 in an open position, through 3-3', in accordance with a first preferred embodiment of the present invention. In this embodiment the jaw 132 comprises two tapered planar surfaces 302, 304 and the jaw 134 comprises two tapered planar surfaces 306, 308. The tapered planar surfaces 302, 304 for jaw 132 intersect at an apex 310 along a line which is parallel to the central axis of the chamber AX. Similarly, the tapered planar surfaces 306, 308 for jaw 134 intersect at an apex 312 along a line which is parallel to the central axis of the chamber AX. Thus, in this plan view the tapered planar surfaces 302 form a "V" shaped outline as do the tapered planar surfaces 304.

Figure 4:
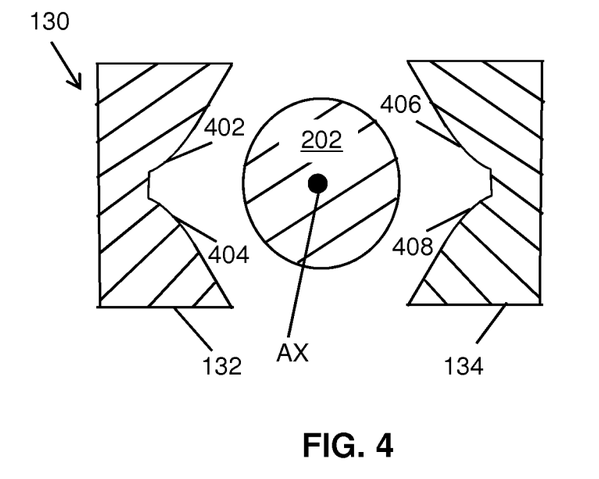
FIG. 4 a schematic cross sectional plan view of the clamp of FIG. 2 in an open position, through 3-3', in accordance with a second preferred embodiment of the present invention.

Referring to FIG. 4 there is illustrated a schematic cross sectional plan view of the clamp 130 in an open position, through 3-3', in accordance with a second preferred embodiment of the present invention. In this embodiment the jaw 132 comprises two tapered surfaces 402, 404 and jaw 134 comprises two tapered surfaces 406, 408. Also, as illustrated, each of the tapered surfaces 402, 404, 406 and 408 has a curved surface.

Figure 5:
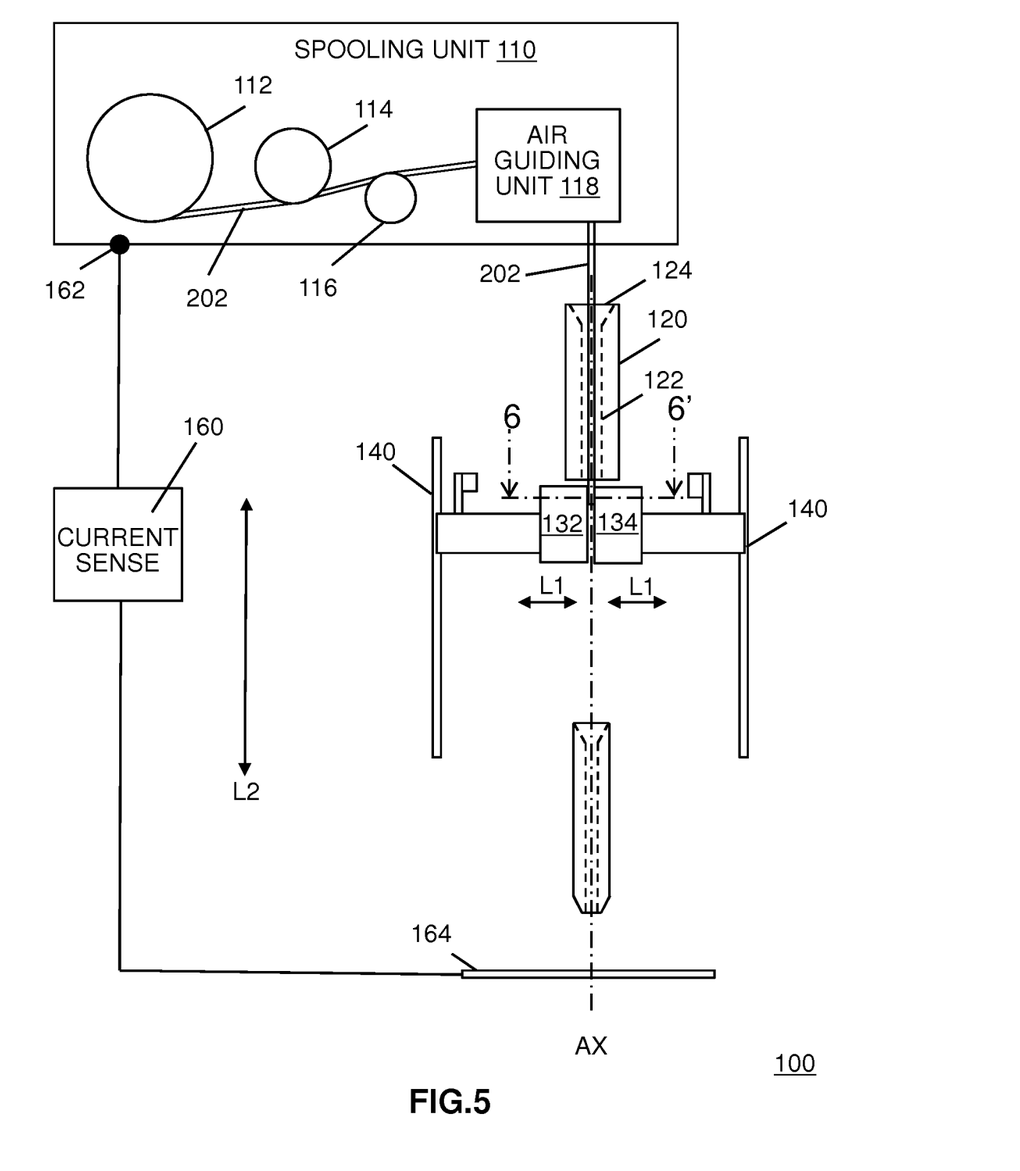
FIG. 5 is a schematic diagram of the wire feed system in a second operating position when feeding the bond wire in accordance with a preferred embodiment of the present invention.

Referring to FIG. 5 there is illustrated a schematic diagram of the wire feed system 100 in a second operating position when feeding the bond wire 202 in accordance with a preferred embodiment of the present invention. In this second operating position the presence of the bond wire 202 has been initially detected since the infra-red signal IR is blocked from reaching receiver 146, the clamp 130 has therefore been actuated to grip the bond wire 202.

Figure 6:
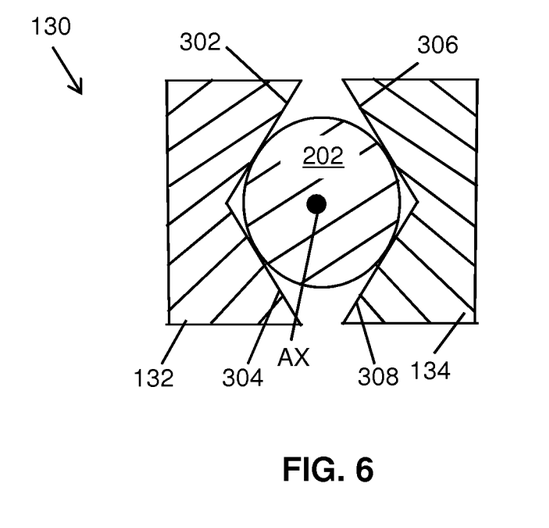
FIG. 6 is a schematic cross sectional plan view of the clamp in a closed position, through 6-6' of FIG. 5, in accordance with the first preferred embodiment of the present invention.

Referring to FIG. 6 there is illustrated a schematic cross sectional plan view of the clamp 130 in a closed position, through 6-6', in accordance with the first preferred embodiment of the present invention. As shown, parts of the tapered planar surfaces 302, 304, 306, 308 that abut the bond wire 202 are equidistant from the central axis of the chamber AX which is coaxial with the central axis of the bond wire 202. In other words, the jaws 132, 134 are arranged to grip and straighten the bond wire 202 which aligns the central axis of the bond wire 202 with the central axis of the chamber AX.

Figure 7:
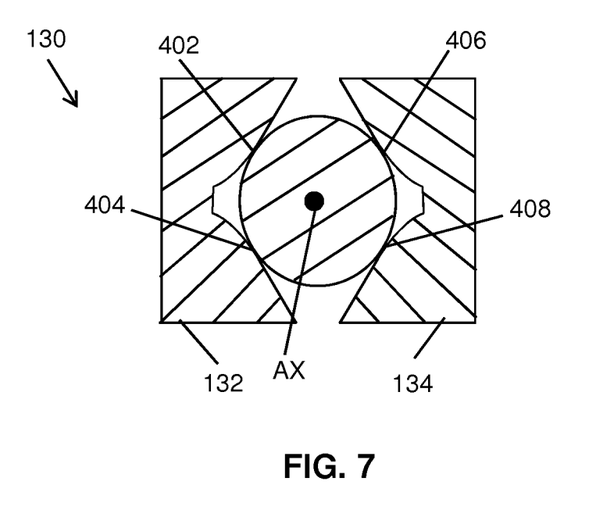
FIG. 7 a schematic cross sectional plan view of the clamp in a closed position, through 6-6' of FIG. 5, in accordance with the second preferred embodiment of the present invention.

Referring to FIG. 7 there is illustrated a schematic cross sectional plan view of the clamp 130 in a closed position, through 6-6', in accordance with the second preferred embodiment of the present invention. As shown, curved parts of the tapered surfaces 402, 404, 406, 408 abut the bond wire 202 at locations that are equidistant from the central axis of the chamber AX which is coaxial with the central axis of the bond wire 202. Again, in other words, the jaws 132, 134 are arranged to grip and straighten the bond wire 202 and thereby align the central axis of the wire with the central axis of the chamber AX.

Figure 8:
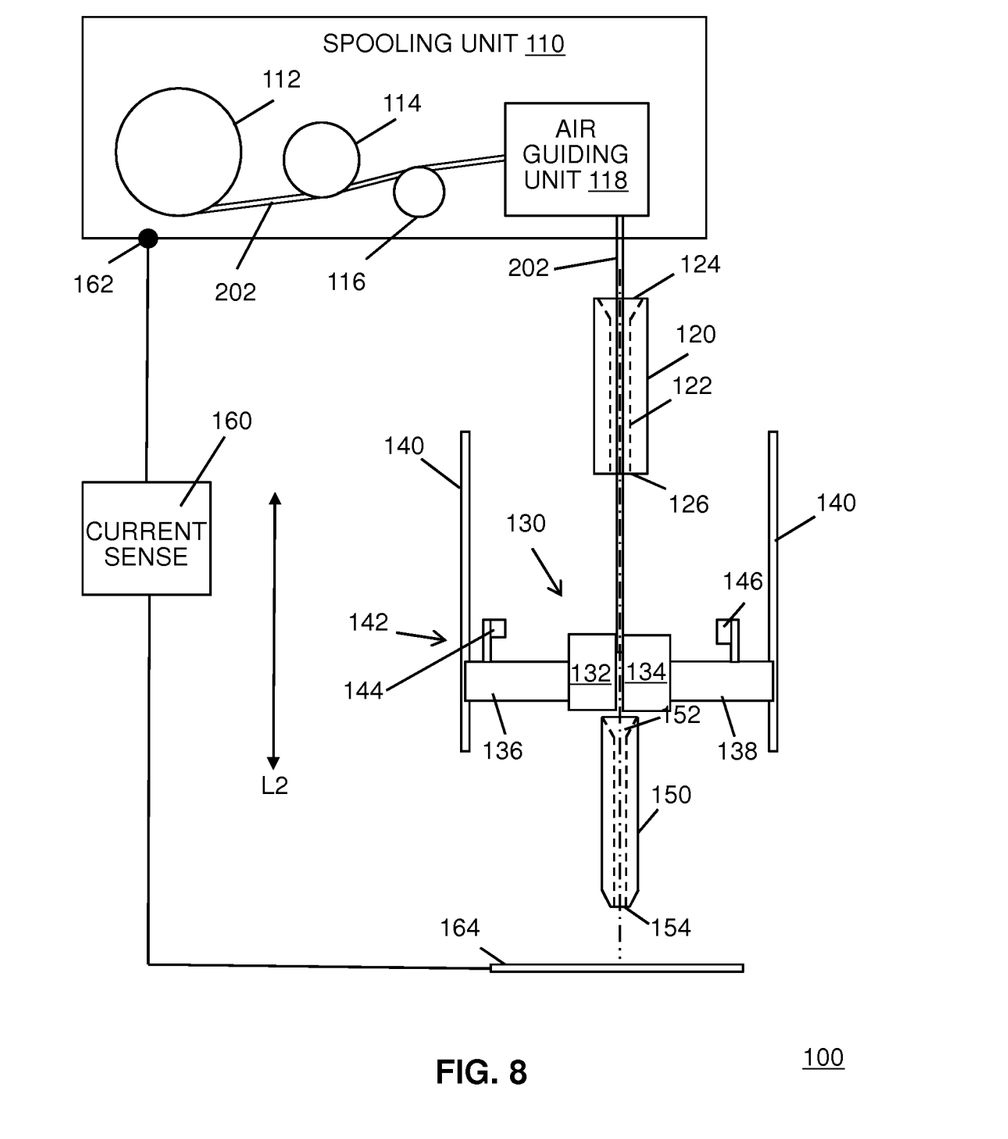
FIG. 8 is a schematic diagram of the wire feed system in a third operating position when feeding the bond wire in accordance with a preferred embodiment of the present invention.

Referring to FIG. 8 there is illustrated a schematic diagram of the wire feed system 100 in a third operating position when feeding a bond wire 202 in accordance with a preferred embodiment of the present invention. In this third operating position, the clamp 130, whilst gripping the bond wire 202, has moved along the track rails 140 away from the tensioning unit 120 and towards the capillary welding tube 150 as indicated by arrowed line L2. Thereafter, the clamp 130 releases the bond wire 202 and moves along the track rails 140 away from the tensioning unit 120 and towards the tensioning unit 120.

Figure 9:
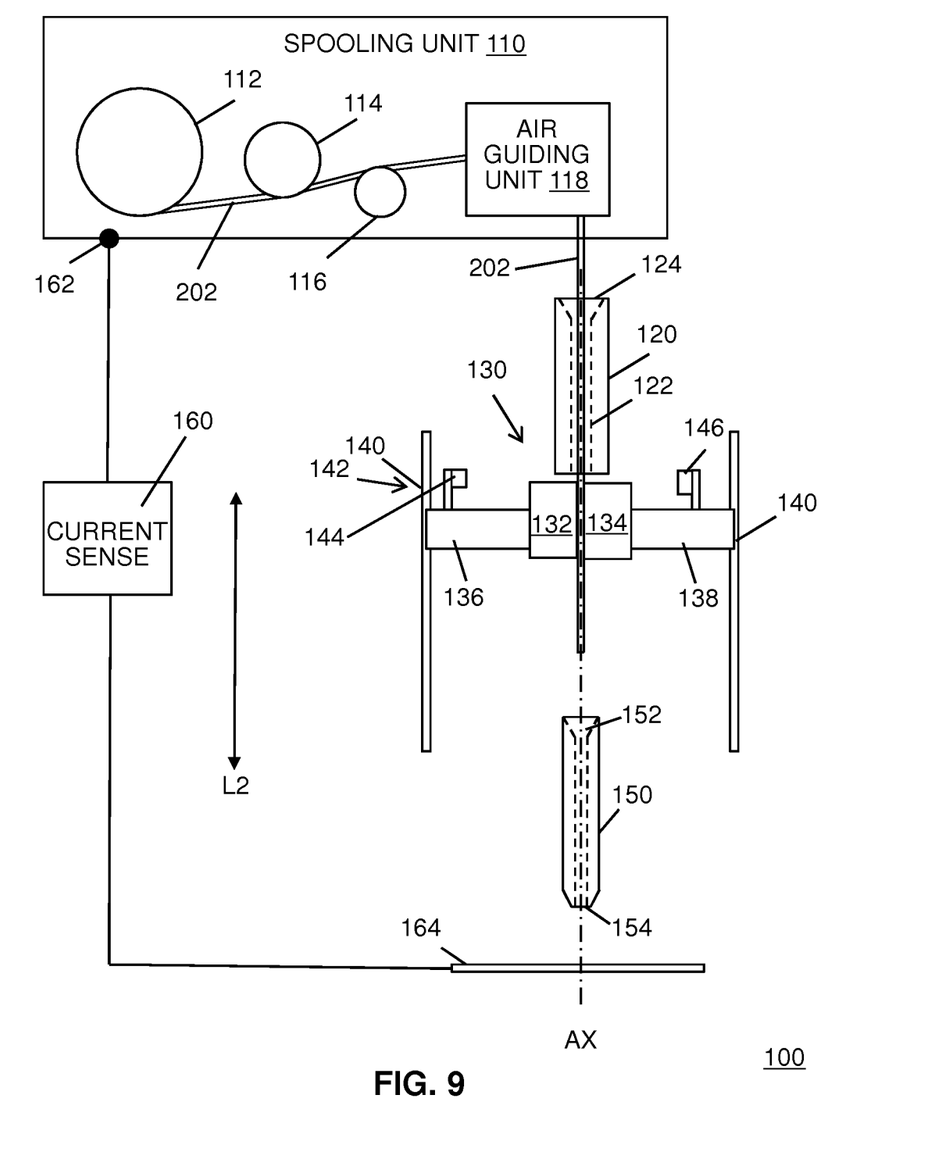
FIG. 9 is a schematic diagram of the wire feed system in a fourth operating position when feeding the bond wire in accordance with a preferred embodiment of the present invention.

Referring to FIG. 9 there is illustrated a schematic diagram of the wire feed system 100 in a fourth operating position when feeding a bond wire 202 in accordance with a preferred embodiment of the present invention. In this fourth operating position, the clamp 130 again has gripped the bond wire 202 which now extends from the clamp 130 towards the capillary welding tube 150. The clamp 130 is now ready to again move along the track rails 140 away from the tensioning unit 120 and towards the capillary welding tube 150. This movement will result in the feeding of the bond wire 202 into the tapered capillary welding tube inlet 152 and out of the capillary welding tube outlet 154.

Figure 10:
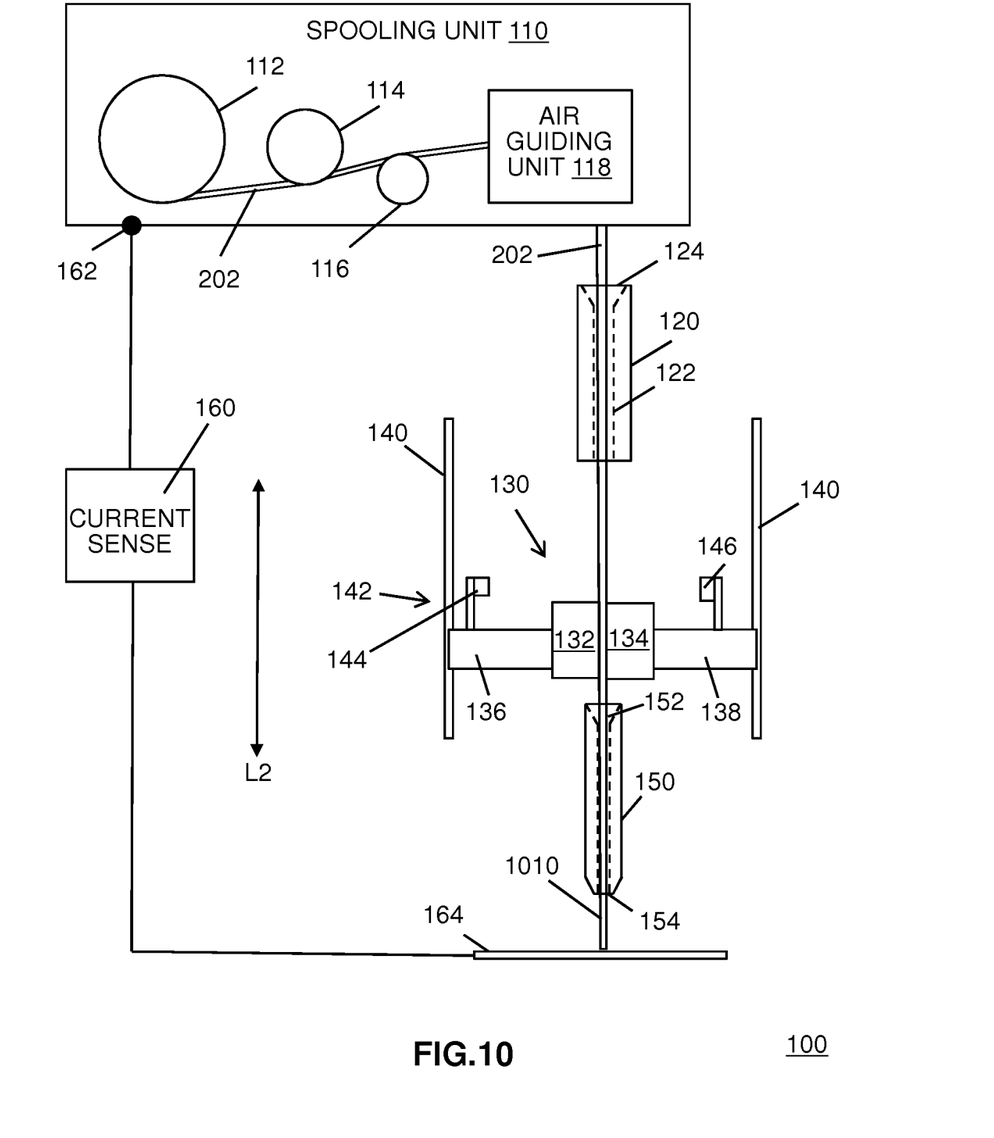
FIG. 10 is a schematic diagram of the wire feed system in a fifth operating position when feeding the bond wire in accordance with a preferred embodiment of the present invention.

Referring to FIG. 10 there is illustrated a schematic diagram of the wire feed system 100 in a fifth operating position when feeding a bond wire 202 in accordance with a preferred embodiment of the present invention. As shown, in operation when the fifth operating position is reached the bond wire 202 has been fed through the capillary tube 150 so that an end section 1010 of the bond wire protrudes from the capillary welding tube outlet 154. This is achieved because the jaws 130 have been gripping the bond wire 202 wire whilst moving along the central axis of the chamber AX which is also both the central axis of the bond wire 202 and central axis of the capillary tube 150. Consequently, since the jaws 130 are movable along the central axis of the bond wire 202 they provide for straightening and aligning the bond wire 202 and pulling it through the wire tensioning unit 120 and threading the bond wire 202 through the capillary welding tube 150.

When in the fifth operating position the first one of the nodes 162 is in permanent electrical contact with the bond wire 202. This is typically achieved by having a metallic spooler 112 electrically connected to the node 162 Also, a second one of the nodes 164 is located to make electrical contact with the bond wire only when the end section 1010 of the bond wire 202 protrudes through the capillary tube outlet 154. Thus, the system 100 moves the end section 1010 towards a contact area of the second one of the nodes 164 to determine if a complete electrical circuit is formed. The formation of such a circuit is formed indicates signifies there is an actual end section 1010 protruding through the capillary tube outlet 154, otherwise an insufficient or null protruding bond wire length is determined. Typically, the contact area is provided by a lead frame that abuts the second one of the nodes 164 in which the lead frame is mounted on a wired bonding machine fed by the system 100.

Figure 11:
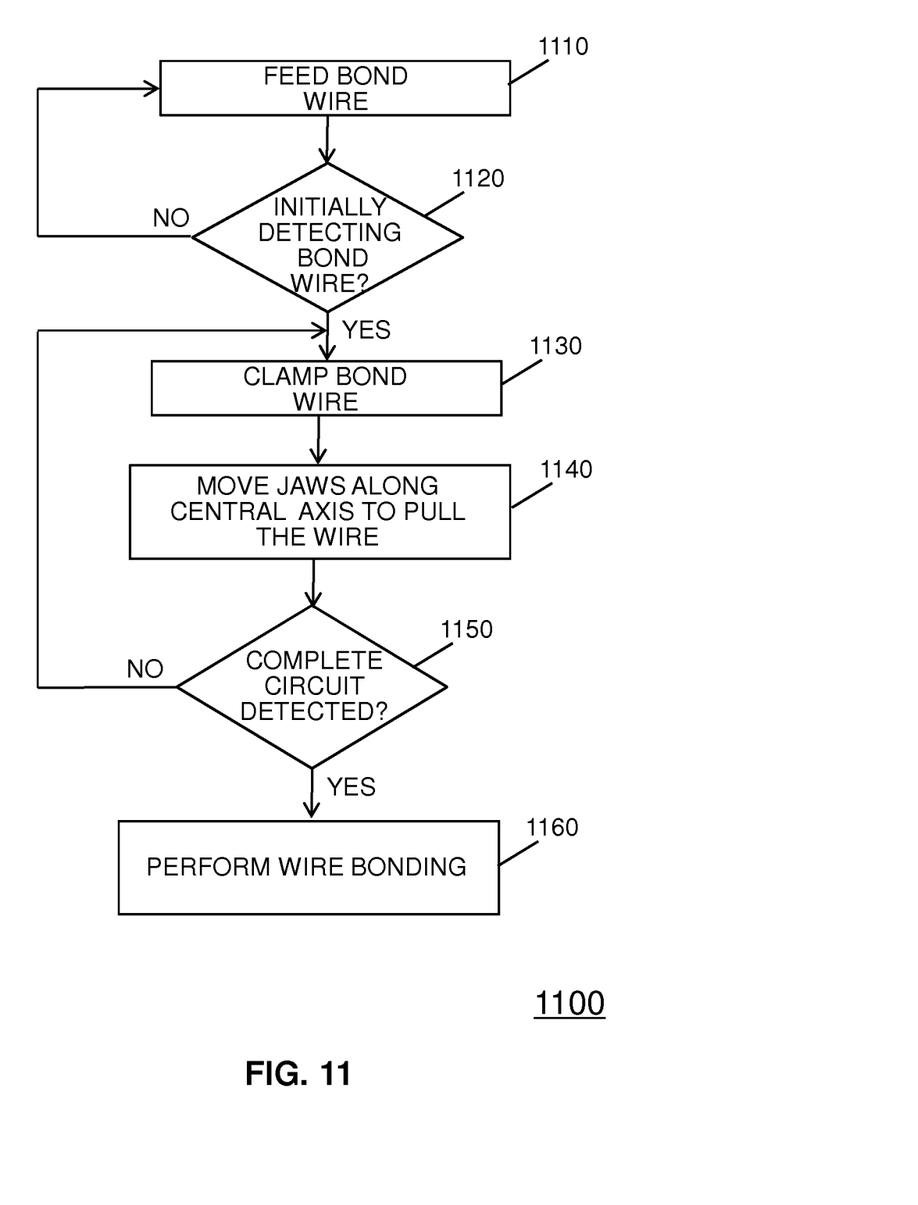
FIG. 11 is a flow chart of a method of feeding a bond wire to a wire bonding machine, in accordance with a preferred embodiment of the present invention.

Referring to FIG. 11 there is illustrated a flow chart of a method 1100 of feeding a bond wire to a wire bonding machine, in accordance with a preferred embodiment of the present invention. By way of illustration only, the method 1100 will be described with reference to the wire feed system 100. The method 1100 starts a feeding block 1110 that performs feeding the bond wire through the wire tensioning unit 120. A decision block 1120 provides for initially detecting, by the sensor 142, the presence of the bond wire 202 when protruding from the wire outlet aperture 126 (the first operating position). If the presence of the bond wire 202 is undetected, the method 1100 returns to block 1110 and more of the bond wire 202 is fed through the wire tensioning unit 120 and the block 1120 again checks for the presence of the bond wire 202.

In response to the detection of the presence of the bond wire 202, at block 1120, a process of clamping the bond wire 202 with the clamp 130 when positioned to receive the bond wire 202 is performed. The process of clamping is performed at a clamping block 1130 in which the jaws 132, 134 of the clamp 130 grip the bond wire 202 to align the central axis AX of the bond wire 202 with the central axis of the chamber 122 (the second operating position). In the first preferred clamp embodiment this alignment is due to the tapered surfaces 302, to 308 of the clamp 130 which are arranged and configured to align bond wires 202 of various diameters. This is because all areas of the planar tapered surfaces 302, to 308 are equidistant from the central axis AX (which is coaxial with the central axis of the bond wire 202). In the second preferred clamp embodiment this alignment is due to the tapered surfaces 402, to 408 having curved regions. These curved regions abut the bond wire 202 at locations that are equidistant from the central axis of the chamber AX (which is coaxial with the central axis of the bond wire 202).

At a moving block 1140, the jaws 132,134 are moved along the central axis of the bond wire 202 thereby pulling the bond wire 202 through the wire tensioning unit 120 (the third operating position). Also, due to the coaxial alignment of the central axis of the bond wire 202 and capillary welding tube 150 the moving of the jaws 132 whilst clamping the bond wire 202 results in the feeding of the bond wire 202 through a capillary welding tube 150.

At a detecting test block 1150, a process of determining that an end section 1010 of the bond wire 202 protrudes through the outlet 154 of the capillary welding tube 150 abuts a contact area of node 164 (the fifth operating position) which is part of a current sensing circuit 160. When in this abutting position, the detecting test block 1150 detects if a complete electrical circuit (detected current sensing circuit 160) is formed by the end section of the bond wire 202 contacting the contact area associated with the node 164. If a complete electrical circuit is not formed, then the method 1100 repeats block 1130 (the fourth operating position) to block 1150 until a complete electrical circuit is detected (the fifth operating position). Thus, when a complete electrical circuit is undetected the method 1100 controls the jaws 132, 134 to feed a length of the bond wire 202 through the capillary welding tube 150. After detection of the complete electrical circuit the method 1100 performs a wire bonding process, at block 1160.

During the wire bonding process a short tail or no tail test is repeated in which the capillary welding tube 150 is moved in unison with the clamp 130 whilst clamping the bond wire 202 so that the outlet 154 of the capillary welding tube 150 is proximal to the contact area of the node 164. If a complete electrical circuit is not detected by the current sensing circuit 160 the processes of blocks 1130 to 1150 are performed until a tail is detected.

In this particular embodiment, the contact area associated with the node 164 is part of a lead frame sheet and thus the wire bonding process is performed on semiconductor dies mounted on the lead frame sheet.

Advantageously, the present invention alleviates one or more problems associated bond wire threading in which the clamps straighten and align the wire for ease of pulling through the wire tensioning unit 120 and threading through the capillary welding tube 150. Also, the current sensing circuit 160 reduces the possibility of damage to die electrodes caused by an insufficient bond wire length protruding through the capillary welding tube 150.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A wire feed system for a wire bonding machine, the system comprising:
   a wire tensioning unit having a chamber with a wire inlet aperture and a wire outlet aperture with centers that are aligned with a central axis of the chamber; and
   a clamp positioned to receive a bond wire provided from the wire outlet aperture, wherein the clamp has at least two jaws movable relative to each other and arranged to grip the wire to align a central axis of the wire with the central axis of the chamber, and wherein the jaws are movable along the central axis of the wire in order to pull the wire through the wire tensioning unit, wherein each of the jaws comprises two tapered surfaces to contact the bond wire at two tangent points in a cross-sectional view.

2. The wire feed system as claimed in claim 1, wherein in the tapered surfaces for each jaw are planar surfaces which intersect along a line which is parallel to the central axis of the chamber.

3. The wire feed system as claimed in claim 1, wherein each of the tapered surfaces has a curved surface.

4. The wire feed system as claimed in claim 1 further comprising a sensor located to detect the presence of the wire when protruding from the wire outlet aperture, wherein in operation when the presence of the wire is initially detected the clamp is actuated to grip the wire.

5. The wire feed system as claimed in claim 1, further including a capillary welding tube with a capillary welding tube inlet and capillary welding tube outlet the centers of which are aligned with the central axis of the capillary tube.

6. The wire feed system as claimed in claim 5, wherein in operation the wire is fed through the capillary tube as a result of the jaws gripping the wire and moving along the central axis.

7. The wire feed system as claimed in claim 6, further including a current sensing circuit with two nodes, wherein in operation a first one of the nodes is in permanent electrical contact with the wire and a second one of the nodes is located to make electrical contact with the wire only when it protrudes through the capillary tube outlet.

8. The wire feed system as claimed in claim 7, wherein in operation the second one of the nodes abuts a lead frame mounted on a wire bonding machine.

9. The wire feed system as claimed in claim 7, further including a wire spooling unit that supplies the wire to the wire inlet aperture, wherein the first one of the two nodes in operation is located on the wire spooling unit.

10. A method of feeding a bond wire to a wire bonding machine, the method comprising:
    feeding the bond wire through a wire tensioning unit having a chamber with a wire inlet aperture and a wire outlet aperture that have centers that are aligned with a central axis of the chamber;
    clamping the bond wire with a clamp positioned to receive the bond wire provided from the wire outlet aperture, the clamp having at least two jaws movable relative to each other and arranged to grip the wire to align a central axis of the wire with the central axis of the chamber; and
    moving the jaws along the central axis of the wire thereby pulling the wire through the wire tensioning unit, wherein each of the jaws comprises two tapered surfaces to contact the bond wire at two tangent points in a cross-sectional view.

11. The method of claim 10, wherein the tapered surfaces for each jaw are planar surfaces which intersect along a line which is parallel to the central axis of the chamber.

12. The method of claim 10, wherein each of the tapered surfaces has a curved surface.

13. The method of claim 10, further comprising initially detecting the presence of the wire when protruding from the wire outlet aperture and in response thereto performing the clamping.

14. The method of claim 10, wherein the moving provides for feeding the bond wire through a capillary welding tube.

15. The method of claim 14, further including determining that an end section of the bond wire protrudes through an outlet of the capillary welding tube.

16. The method of claim 15, wherein the determining comprises:
    moving the capillary welding tube so that the outlet of the capillary welding tube is proximal to a contact area which is part of a current sensing circuit; and
    detecting if a complete electrical circuit is formed by the end section of the bond wire contacting the contact area.

17. The method of claim 16, wherein the contact area is part of a lead frame sheet.

18. The method of claim 16, wherein if a complete electrical circuit is undetected the method controls the jaws to feed a length of the bond wire through the capillary welding tube.

* * * * *